United States Patent
Murden

(10) Patent No.: US 7,268,720 B1
(45) Date of Patent: Sep. 11, 2007

(54) CONVERTER NETWORKS FOR GENERATION OF MDAC REFERENCE SIGNALS

(75) Inventor: Frank M. Murden, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/479,724

(22) Filed: Jun. 30, 2006

(51) Int. Cl.
*H03M 1/38* (2006.01)
*H03M 1/12* (2006.01)

(52) U.S. Cl. .................. 341/161; 341/155; 327/73; 327/103

(58) Field of Classification Search ............ 341/119, 341/161, 136, 158, 155; 327/73, 103
See application file for complete search history.

(56) References Cited

U.S. PATENT DOCUMENTS

| | | | |
|---|---|---|---|
| 3,867,650 A * | 2/1975 | Baldwin ................ | 327/73 |
| 4,766,415 A * | 8/1988 | Dielacher .............. | 341/119 |
| 4,804,960 A * | 2/1989 | Fernandes et al. ...... | 341/158 |
| 5,001,362 A * | 3/1991 | Tran ..................... | 327/103 |
| 5,952,952 A | 9/1999 | Choi et al. ............. | 341/172 |
| 6,249,240 B1 | 6/2001 | Bellaouar ............... | 341/172 |
| 6,313,692 B1 | 11/2001 | Pease ................... | 327/538 |
| 6,323,800 B1 | 11/2001 | Chiang ................. | 341/161 |
| 6,337,651 B1 | 1/2002 | Chiang ................. | 341/161 |
| 6,489,904 B1 | 12/2002 | Hisano ................. | 341/120 |
| 6,861,969 B1 | 3/2005 | Ali ...................... | 341/161 |
| 6,864,820 B2 | 3/2005 | Nakamura et al. ..... | 341/155 |
| 2002/0109618 A1* | 8/2002 | Clara et al. ........... | 341/136 |

OTHER PUBLICATIONS

Bo Xia, Alberto, et al., "A 10-bit 44-MS/s 20-mW Configurable—Receiver", IEEE Journal of Solid-State Circuits, vol. 41, No. 3, Mar. 2006, pp. 530-539.
Yoo, Sang-Min, et al., "A 2.5 V 10-b 120-MSample/s CMOS Pipelined ADC—Switching", IEEE Transactions on Circuits and Systems, vol. 51, No. 5, May 2004, pp. 269-275.
Chang, Dong-Young, "Low-Voltage Pipelined ADC—Technique", IEEE 2002 Custom Integrated Circuits Conference, May 2002, pp. 461-464.
Chang, Dong-Young, et al., "A 1.4V 10-bit 25-MS/s Pipelined ADC—Technique", IEEE Journal of Solid-State Circuits, vol. 38, No. 8, Aug. 2003, pp. 1401-1404.
Ryu, Seung-Tak, et al., "A 14-b Linear Capacitor Self-Trimming Pipelined ADC", EEE Journal of Solid-State Circuits, vol. 39, No. 11, Nov. 2004, pp. 2046-2051.
"Understanding Pipelined ADCs", Maxim Dallas Semiconductor, Application Note 1023, 5 pages, Mar. 1, 2001.

* cited by examiner

*Primary Examiner*—Jean Bruner Jeanglaude
(74) *Attorney, Agent, or Firm*—Koppel, Patrick, Heybl & Dawson

(57) ABSTRACT

Reference network embodiments are disclosed that provide reference signals to, for example, switched-capacitor multiplying digital-to-analog converters (MDACs) in pipelined analog-to-digital converters (ADCs). These embodiments are configured to maintain accuracy of the levels of the reference signals in the presence of high speed charge-injection and charge-extraction currents which are presented by the MDACs.

20 Claims, 4 Drawing Sheets

CONVERTER NETWORKS FOR GENERATION OF MDAC REFERENCE SIGNALS

BACKGROUND OF THE INVENTION

1. Field of the Invention

The present invention relates generally to signal converters.

2. Description of the Related Art

Pipelined analog-to-digital converters (ADCs) are capable of achieving impressive resolution and performance (e.g., 10 bit quantization and 80 dB spurious free dynamic range) at high sample rates (e.g., 200 megasamples per second). Accordingly, they are useful in a wide range of demanding converter applications (e.g., charge-coupled device (CCD) imaging, ultrasonic medical imaging, base station processing, digital receivers, digital video, cable modems, digital subscriber line (DSL) systems, and Ethernet systems).

In an initial converter stage of an exemplary pipelined ADC structure, a first sample of an analog input signal is initially provided to that stage's converter which quantizes the analog sample to a corresponding n digital bits. An associated digital-to-analog converter (DAC) in the initial stage converts the n digital bits to a corresponding analog signal which is subtracted from the first analog sample to provide a "residue signal".

To complete the conversion of the first analog sample, this residue signal is converted to one or more corresponding digital codes in one or more downstream converter stages. To enhance conversion accuracy in the first succeeding downstream converter stage, the residue signal of the initial stage is "gained up" in an amplifier so that the analog window presented to the succeeding stage substantially matches the analog window presented to the initial stage.

The gained-up residue is then passed to the succeeding downstream stage for conversion to a corresponding m digital bits in a manner similar to that described above in the initial converter stage wherein m may or may not equal n. Because the residue is "multiplied", the structure that provides the gained-up residue is typically referred to as a multiplying DAC or, equivalently, an MDAC.

This conversion process continues in succeeding converter stages until there is no further residue to be converted. It is important to understand that the processing of the first sample in each converter stage takes place while the stage immediately upstream is processing a succeeding second sample of the analog input signal. If there are N converter stages, therefore, it will take N clock cycles to complete the conversion of the first analog sample in the "pipelined" structure.

The converted bits from each stage are appropriately delayed in digital registers so that they are all aligned when the last bits become available. To enhance the conversion accuracy, the converter stages are often configured to produce redundant bits and all bits are processed with a digital error correction technique to derive the final corresponding digital code.

The residue signals of pipelined converters are often generated in switched-capacitor. MDACs in which one or more capacitors in a succeeding converter stage are switched to sample (acquire charge from) the residue signal of the preceding stage in a first portion of a system's clock period. In the latter portion of this clock period, one or more capacitors are switched to alter this residue signal in accordance with the quantization decision of the succeeding stage.

In particular, the quantization decision is used to select an appropriate one of predetermined reference signals which is then applied to at least one of the capacitors to transfer at least a portion of the previously-acquired charge to another of the capacitors. Generally, at least one capacitor is arranged about a high gain amplifier and the capacitors are sized and arranged to provide the multiplying gain referred to above.

It is apparent that any error in the value of the predetermined reference signals is directly transferred into error in the gained-up residue signal and thus the accuracy of the conversion process is degraded. Accordingly, the generation of the predetermined reference signals is critical to the performance of the converter system.

BRIEF SUMMARY OF THE INVENTION

The present invention is generally directed to converter structures and methods for generation of MDAC reference signals. The drawings and the following description provide an enabling disclosure and the appended claims particularly point out and distinctly claim disclosed subject matter and equivalents thereof.

DETAILED DESCRIPTION OF THE INVENTION

Pipelined ADCs often include a plurality of switched-capacitor MDACs which require high quality reference signals in their operation. To avoid degrading the accuracy of these pipelined structures, a reference network must provide and maintain the levels of these reference signals in the presence of high speed charge-injection and charge-extraction currents which are demanded by the MDACs. Reference network embodiments of the present invention are particularly suited to provide this demanding performance.

Figure 1:
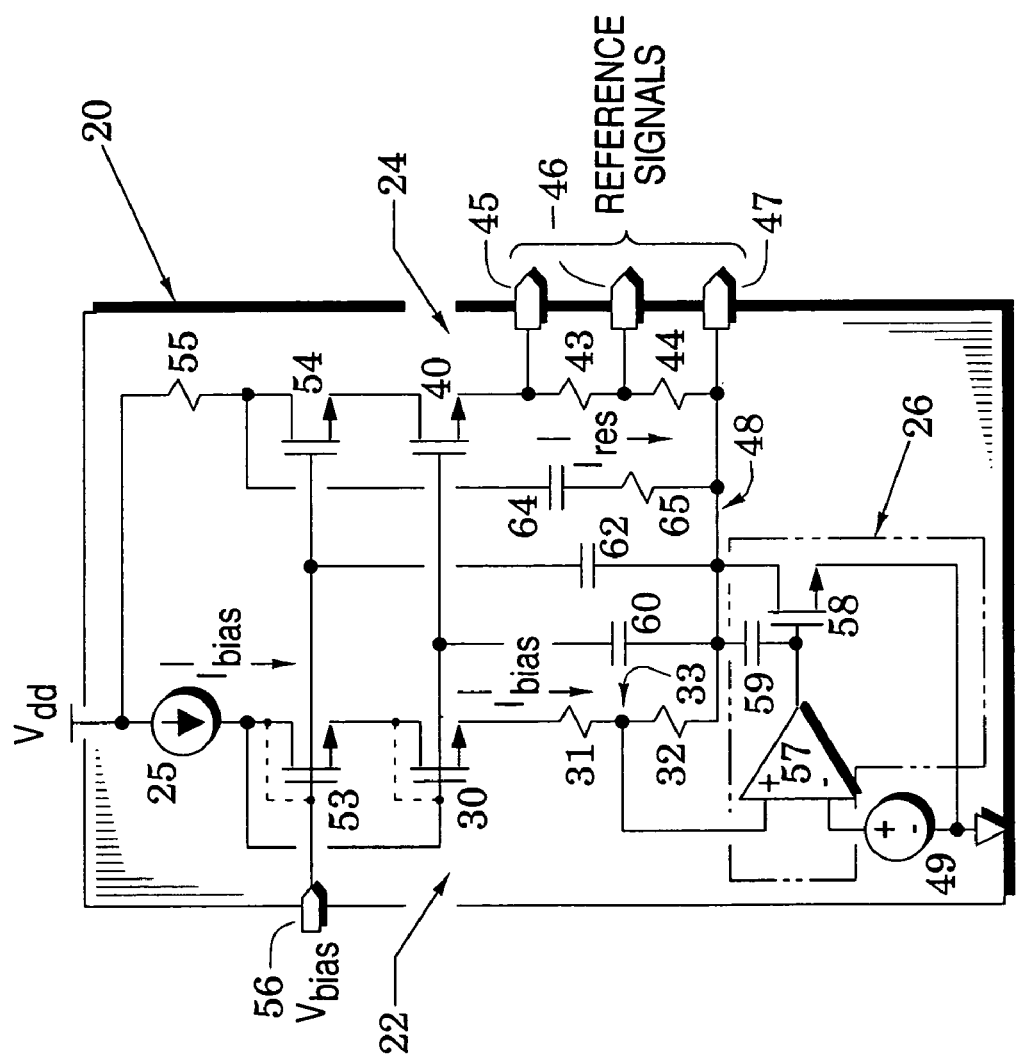
FIGS. 1 and 2 are schematics of reference network embodiments of the present invention.

In particular, the reference network embodiment 20 of FIG. 1 includes a first circuit path 22, a second circuit path 24, a current source 25 and a feedback network 26. The first circuit path 22 is defined by a first transistor 30 and first and second resistors 31 and 32 wherein the first resistor is coupled between the second resistor and a current terminal (e.g., source) of the first transistor and wherein the first and second resistors define a feedback node 33 therebetween.

The second circuit path 24 is defined by a second transistor 40 and third and fourth resistors 43 and 44 wherein the third resistor is coupled between the fourth resistor and a current terminal (e.g., source) of the second transistor.

Network reference ports 45, 46 and 47 are coupled to circuit nodes at outer terminals of the third and fourth resistors and at a common inner terminal of these resistors.

Control terminals (e.g., gates) of the first and second transistors 30 and 40 are coupled together and the current source 25 is arranged to drive a bias current $I_{bias}$ through the first transistor 30. The feedback network 26 is arranged to drive a shared node 48 of the first and fourth resistors 32 and 44 and reduce a difference between a feedback voltage at the feedback node 33 and a predetermined voltage of a voltage source 49.

Although the first and second transistors 30 and 40 are sufficient to enable the network embodiment 20, another network embodiment supplements them with third and fourth transistors 53 and 54 which have their control terminals coupled together and are respectively coupled in cascode arrangements with the first and second transistors 30 and 40. A supply voltage $V_{dd}$ is applied to the current source 25 and is preferably applied through a small resistor 55 to the third transistor 54. In this embodiment, the cascoded transistors substantially isolate the first and second circuit paths (e.g., from the supply voltage) and enhance control of common-mode and differential signal levels.

To lower the headroom requirements of this latter reference embodiment, the control terminal of the first transistor 30 is coupled in FIG. 1 to a current terminal (e.g., drain) of the third transistor 53 and a predetermined bias voltage $V_{bias}$ is applied at a bias port 56 and coupled to the coupled control terminals of the third and fourth transistors 53 and 54. This bias voltage $V_{bias}$ is preferably reduced to a value that is just sufficient to insure that the first transistor 30 remains in saturation. In this arrangement, the third transistor 53 is preferably sized so that, given the bias current $I_{bias}$, its overdrive voltage (the amount that the voltage between its control and lower current terminals exceeds its threshold voltage) is less than its threshold voltage. For applications in which headroom is less critical, another network embodiment may simply connect both the first and third transistors 30 and 53 as diode-coupled transistors (as indicated by broken-line paths associated with each transistor).

In operation of the network embodiment 20, the bias current $I_{bias}$ is set at a low value to enhance the network's efficiency. This current travels through the first and second resistors 31 and 32 and establishes a feedback voltage at the feedback node 33. The feedback network 26 drives the shared node 48 as required to reduce the difference between the feedback voltage and the predetermined voltage of the voltage source 49. With sufficient gain in the feedback network, the voltage at the shared mode 48 is essentially controlled to take on the predetermined voltage.

Because it shares its control terminal with that of the first transistor 30, the second transistor is controlled to respond with a response current $I_{resp}$ that is driven through the third and fourth resistors 43 and 44 to thereby establish reference signals at reference ports 45, 46 and 47. In a network embodiment, the first and second resistors 31 and 32 may be equal valued and the third and fourth resistors 43 and 44 may also be equal valued so that the reference signal at the reference port 46 closely approximates the feedback voltage at the feedback node 33. It is apparent by inspection that the signals across the third and fourth resistors 43 and 44 also closely approximates the signals across the first and second resistors 31 and 32.

Accordingly, the predetermined voltage of the voltage source 49 can be selected to obtain a desired feedback signal at the feedback node 33 and thereby set the reference signal at the reference port 46 to a desired level (e.g., zero volts).

When the third and fourth resistors 43 and 44 are equal valued, the reference signals at the reference ports 45 and 47 are equally spaced above and below the reference signal at the reference port 46.

Preferably, the response current $I_{resp}$ is "gained up" to further reduce the output impedance of the second transistor 40. This reduced output impedance enhances operation of the network embodiment 20. For example, it substantially reduces the time for reference signals at the reference nodes 45-47 to recover from any disturbance of their resting levels and substantially resists and reduces such disturbance.

In the embodiment of FIG. 1, the feedback network 26 includes a differential amplifier 57 arranged to generate a difference signal in response to the difference between the feedback voltage at the feedback node 33 and the predetermined voltage of the voltage source 49. A feedback transistor 58 is then coupled to drive the shared node 48 in response to the difference signal. The differential amplifier can be realized with various conventional circuits (e.g., an input transconductance stage and a current mirror).

If the reference signal at the reference port 46 is considered to represent a common-mode level, it is apparent that the feedback network 26 controls the common-mode level. To reduce disturbances of the common-mode level, a feedback capacitor 59 is coupled to the shared node 48 and across the feedback transistor 58. This feedback capacitor resists short-term changes in its voltage and thus it reduces short-term variations in the common-mode level would otherwise be induced, for example, by current variations through the reference ports 45-47.

In a network embodiment, a bootstrap capacitor 60 has a first end coupled to the coupled control terminals of the first and second transistors 30 and 40 and a second end coupled to the shared node 48. Because the bootstrap capacitor resists short-term changes in its voltage, it acts to resist disturbances of the differential level between the shared node 48 and the coupled control terminals of the first and second transistors 30 and 40.

The bootstrap capacitor 60 thus acts to resist disturbances of the differential level between reference signals at the reference ports 45 and 47. The capacitance of the bootstrap capacitor can be increased to enhance this control of the differential level but such increase is preferably limited enough to avoid excessive capacitance that would unacceptably degrade the reference network's turn-on time. In addition to its control of differential reference levels, the bootstrap capacitor 60 functions to bandwidth-limit network noise (e.g., to something on the order of 85 kHz) and causes the output impedance at the reference port 45 to essentially be the low output impedance of the second transistor 40.

In another network embodiment, the bootstrap capacitor 60 can be supplemented with a second bootstrap capacitor 62 which is coupled between the shared node 48 and the coupled gates of the third and fourth transistors 53 and 54. The second bootstrap capacitor acts to resist disturbances of the differential level between the shared node 48 and the coupled control terminals of the third and fourth transistors and this further enhances control of the differential level between reference signals at the reference ports 45 and 47. Together, therefore, the feedback capacitor 59 and the bootstrap capacitors 60 and 62 act to reduce alteration of the common-mode and differential levels of the reference signals.

A third capacitor 64 can be coupled across the third and fourth resistors 43 and 44 and the second and fourth transistors 40 and 54 so that the shared node substantially acts as a small-signal ground. This third capacitor resists short-term changes in the voltage between the shared node and the supply voltage $V_{dd}$ and thus it reduces short-term variations in the common-mode level of the reference signals at the reference ports 45-47. The third capacitor 64 also reduces the level of noise signals that might be present at the shared node 48 (and at the reference ports 45-47). A small resistor 65 may be placed in series with the capacitor 64 to adjust the time constant of this signal path.

It was noted above that increasing the response current $I_{resp}$ acts to reduce the output impedance of the second transistor 40 and enhance operation of the network embodiment 20. This increase of the response current $I_{resp}$ is preferably realized by increasing the size of the second transistor 40 by a factor N and reducing the resistances of the third and fourth resistors 43 and 44 by the same factor N. Therefore, the voltage across the control and current terminals (e.g., $V_{gs}$) of the second transistor 40 substantially equals the voltage across the control and current terminals of the first transistor 30. Accordingly, the second transistor 40 and the first transistor 30 function as a current mirror that mirrors the bias current $I_{bias}$ into the response current $I_{resp}$.

Figure 2:
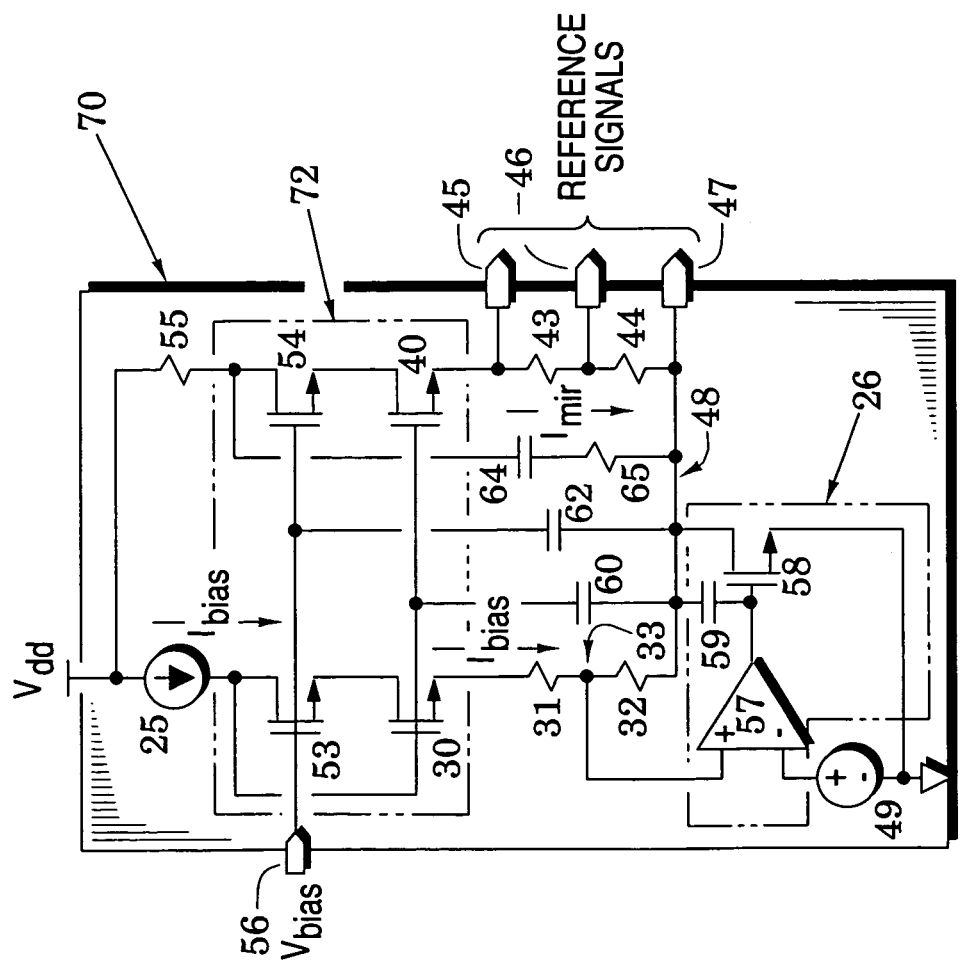

When the gate-coupled third and fourth transistors 53 and 54 are then respectively coupled to the first and third transistors 30 and 53, they form a cascoded current mirror 72 that is shown in a reference network 70 of FIG. 2 which includes elements of the reference network 20 of FIG. 1 with like elements indicated by like reference numbers. Because of this mirroring action, the current through the third and fourth resistors is termed a mirror current $I_{mir}$ in FIG. 2. In an exemplary network embodiment, N can be selected to be on the order of 30 so that the mirror current $I_{mir}$ is substantially 30 times greater the bias current $I_{bias}$.

Figure 3:
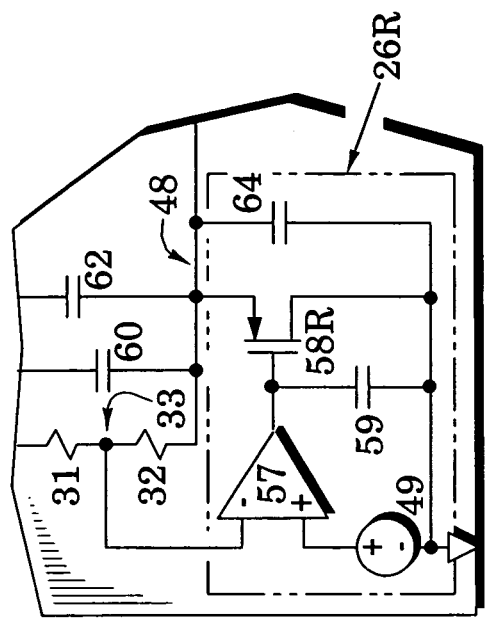
FIG. 3 is a schematic of another feedback network embodiment for use in the reference networks of FIGS. 1 and 2.

FIG. 3 illustrates another feedback network embodiment 26R that can replace the feedback network 26 shown in FIGS. 1 and 2. The feedback network 26R includes elements of the feedback network 26 with like elements indicated by like reference numbers. In contrast to the network 26, however, the network 26R replaces the feedback transistor 58 with a feedback transistor 58R of the opposite polarity. The capacitor 59 is moved so that it continues to be coupled between the gate and drain of the feedback transistor 58.

In addition, the input terminals of the differential amplifier 57 are interchanged so that negative feedback continues to be established. If, for example, a perturbation urges the shared node 48 to rise in the feedback network 26 of FIGS. 1 and 2, this will cause the output voltage of the differential amplifier to rise. This output-voltage rise will, in turn, cause the feedback transistor 58 to pull more current which will substantially cancel the original perturbation at the shared node 48.

In the feedback network embodiment 26R, the same perturbation will cause the output voltage of the differential amplifier to drop. This output-voltage drop will cause the feedback transistor 58R to pull more current which will, again, substantially cancel the original perturbation at the shared node 48.

In the feedback network embodiment 26R, the third capacitor 64 has also been moved so that it capacitively couples the shared node 48 to a different side of the supply voltage (e.g., ground). Essentially, the third capacitor is coupled across the feedback transistor 58. In this different arrangement, the third capacitor 64 will continue to substantially stabilize the common-mode level of the reference signals at the reference ports 45-47 and substantially reduce noise levels at these ports.

Figure 4:
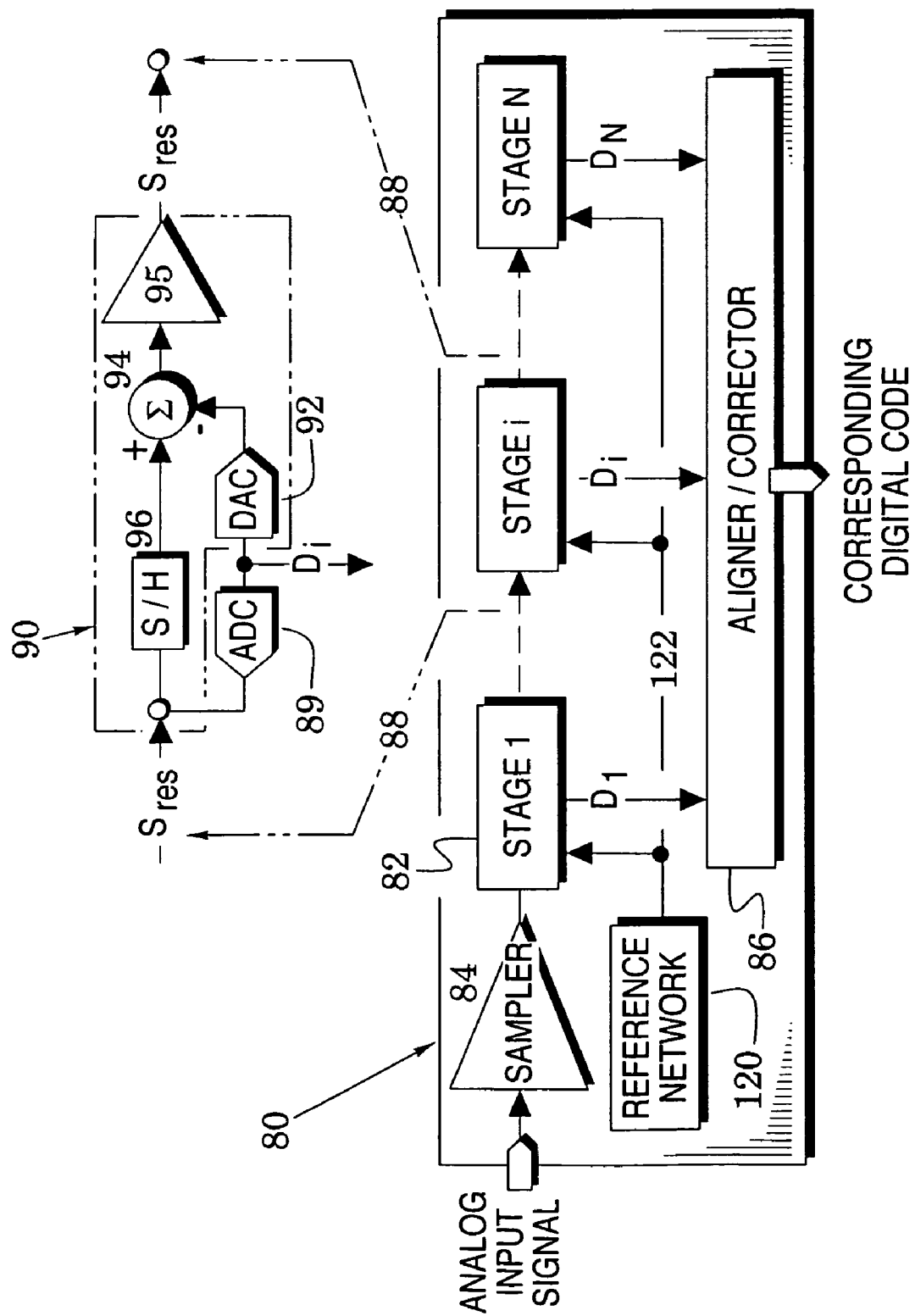
FIG. 4 is a schematic of a pipelined ADC embodiment that can include the reference networks of FIGS. 1 and 2.

The advantages and features of the reference network embodiments of FIGS. 1 and 2 can be better understood in the context of an application in a pipelined ADC such as the ADC 80 of FIG. 4. This pipelined ADC 80 includes a pipelined arrangement of converter stages 82 that process samples of an analog input signal (at an input port 83) that are provided by a sampler 84. During an initial clock cycle, an initial converter stage is configured (e.g., as a flash converter) to quantize a sample to an initial number of digital bits.

The initial converter stage passes the initial bits to a time aligner and error corrector 86 and also forms a "gained-up residue signal" and passes this residue signal $S_{res}$ to a succeeding converter stage. During a succeeding clock cycle, the succeeding converter stage quantizes this signal to provide additional digital bits and again form and pass on a residue signal. This process continues to a final converter stage which provides final digital bits. Because the converter stages provide their respective bits on successive clock cycles, the time aligner and error corrector 86 is configured to selectively delay different one of the bits to bring them into time alignment to generate a digital code that corresponds to the initial analog input signal.

Because each converter stage only has to provide limited quantization, the clock speed and corresponding signal throughput of pipelined ADCs can be quite high. In order to enhance accuracy, it has been found useful to provide redundant digital bits which facilitate the correction of conversion errors. This correction is provided in the aligner/corrector 86.

As shown by extension lines 88, an exemplary converter stage may include a flash converter 89 and an MDAC 90 which has a DAC 92, a summer 94 and an amplifier 95. The converter 90 provides the respective digital bits Di and the DAC 93 converts this quantization to a corresponding analog signal which is subtracted from the input residue signal in the summer 94 to form an output residue signal. This output residue signal is gained up in the amplifier 95 so that the signal window provided to the succeeding converter stage is substantially that presented to the present stage. This gained up signal is the output residue signal that is passed to the succeeding stage for further conversion. A sample/hold circuit 96 is preferably provided to hold the input residue signal while the MDAC processes it into the succeeding residue signal.

Figure 5C:
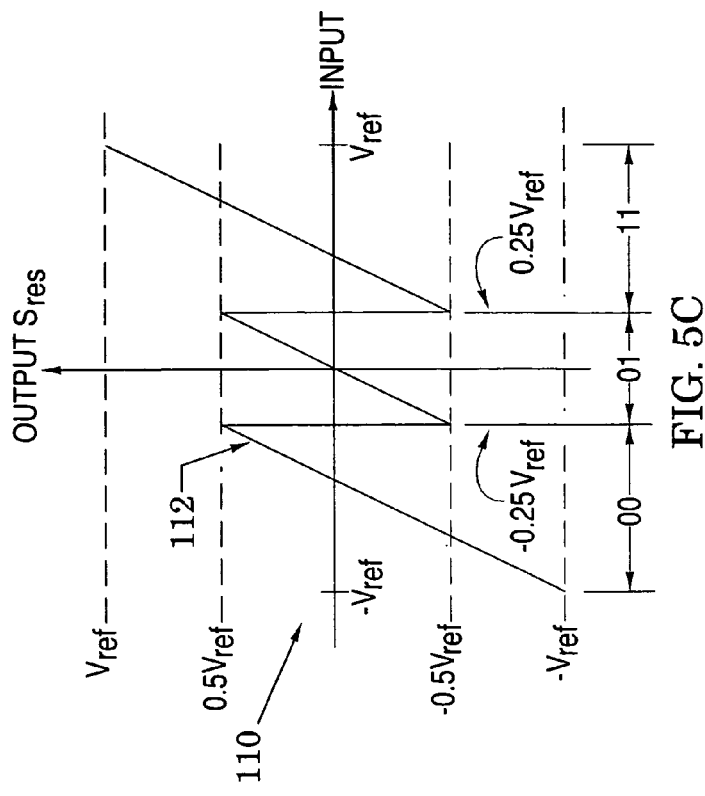
FIG. 5C illustrates a transfer function of a switched-capacitor MDAC during the converter stage operations of FIGS. 5A and 5B.
Figure 5A:
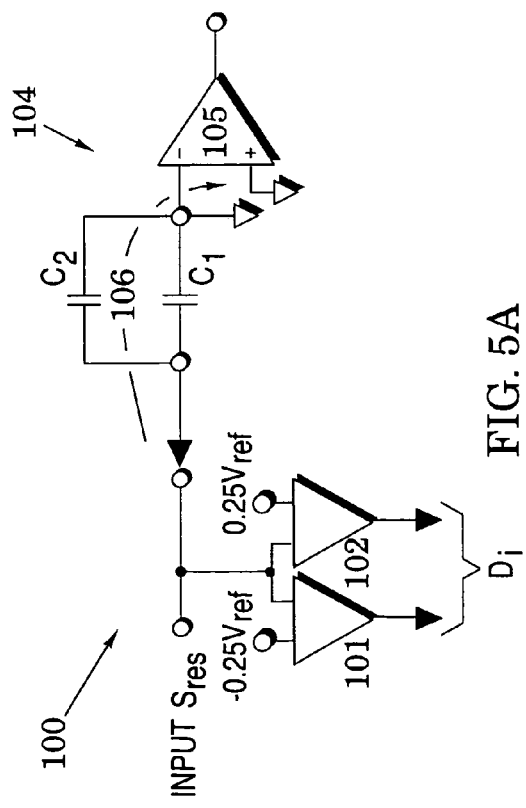
FIGS. 5A and 5B illustrate operational modes of a converter stage in the pipelined ADC of FIG. 2.
Figure 5B:
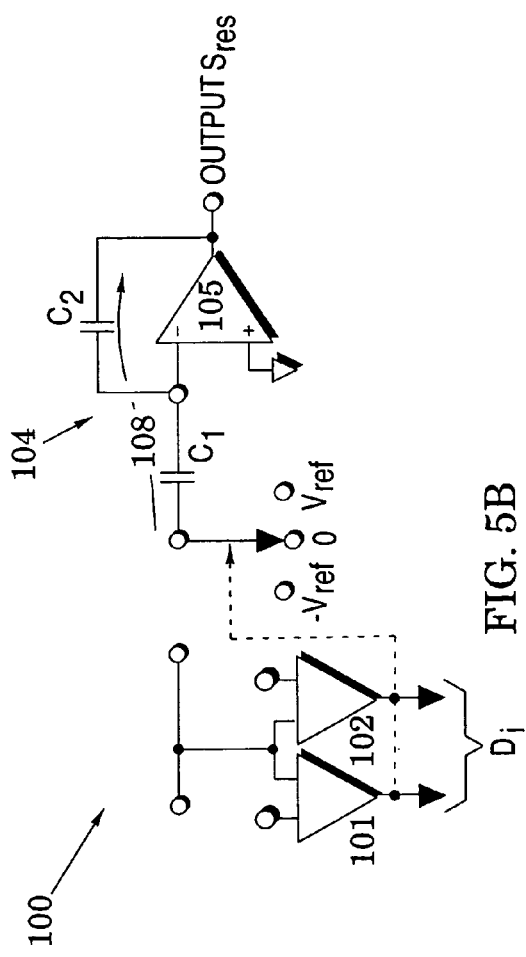

An exemplary MDAC for use in converter stages of the pipelined ADC 80 of FIG. 4 is the switched-capacitor MDAC 104 whose structure and transfer function are shown in FIGS. 5A-5C. The MDAC 100 is shown as part of a 1.5 bit converter stage 100 which can provide redundant bits to the time aligner and error corrector 86 of FIG. 4.

The converter stage 100 has comparators 101 and 102 and the MDAC includes an amplifier 105 and associated capacitors C1 and C2. The comparators 101 and 102 have decision points set at $-0.25\ V_{ref}$ and $0.25\ V_{ref}$ wherein $-V_{ref}$ and $+V_{ref}$ define the edges of the analog input window. Using these decision points, the comparators provide digital bits $D_i$ in accordance with the bit combinations 00, 01 and 11 shown at the lower portion of FIG. 5C.

For example, Di is set to 00 if the input residue signal is less than $-0.25\ V_{ref}$, to 01 if the input residue signal is between $-0.25\ V_{ref}$ and $0.25\ V_{ref}$, and to 11 if the input residue signal exceeds $0.25\ V_{ref}$. If the capacitors C1 and C2 have equal capacitance, the desired transfer function of the 1.5 bit converter stage is, $$\text{OUTPUT } S_{res} = 2(\text{INPUT } S_{res}) \pm V_{res}. \qquad (1)$$

This transfer function is traced out by the trace 112 in FIG. 5C and is realized in the first and second processes of FIGS. 5A and 5B which occur in first and second portions of each clock cycle.

In the first process of FIG. 5A, the capacitors C1 and C2 are switched (switch network not shown) to be between the input residue signal and ground to receive a current 106 and thus sample (receive electrical charge from) the input residue signal. In the second process of FIG. 5B, capacitor C2 is switched to be about the amplifier 105 and the capacitor C1 is switched to be between the amplifier and an appropriate one of the reference signals $-V_{ref}$, 0, and $+V_{ref}$ as determined by the transfer function of FIG. 5C.

This selection is accomplished by a switch system which is controlled (indicated by broken line arrow) by the decisions of the comparators 101 and 102. The selected reference signal transfers electrical charge between the capacitors C1 and C2 as indicated by the transfer current 108. This transfer (which may be in either direction) generates the output residue signal.

The processes of FIGS. 5A and 5B are also carried out by a preceding converter stage that provided the input residue signal. The preceding stage, however, performs the charge-transfer process of FIG. 5B in the clock portion in which the present converter stage performs the sample process of FIG. 5A. The preceding stage then performs the sample process of FIG. 5A in the clock portion in which the present converter stage performs the charge-transfer process of FIG. 5B. This process alteration is repeated down the line of converter stages in FIG. 4.

Accordingly, the ADC 80 of FIG. 4 includes a reference network 120 which provides reference signals 122 to the converter stages 82. From the above description, it is evident that the reference network 120 must provide reference signals (e.g., $-V_{ref}$, 0, and $+V_{ref}$) and hold them constant even as it provides to each converter stage the charge-transfer current 108 of FIG. 5B at a converter system clock rate. As previously noted, any error in the level of the reference signals is directly transferred to the output residue signal and this degrades the accuracy of the pipelined ADC system.

It is seen, therefore, that the charge-transfer currents (e.g., 108 in FIG. 5B) of the various converter stages represent high speed source and sink currents which the reference network must provide and, at the same time, accurately maintain the levels of the reference signals. That is, the reference network must maintain these levels in the presence of high speed charge-injection and charge-extraction currents which is presented by the switched-capacitor MDACs.

It has been found that reference network embodiments of the invention are particularly suited to provide high speed source and sink currents to a plurality of capacitive loads that are represented by the switched-capacitor MDACs of a pipelined ADC. A dynamic measure of this suitability compares the level of a reference signal before the MDACs begin operation to the steady-state level during MDAC operation and determines the resulting variation. In an exemplary 250 megasample per second simulation, it has been found that network embodiments of the invention limit this variation to less than 10 microvolts.

The embodiments of the invention described herein are exemplary and numerous modifications, variations and rearrangements may achieve substantially equivalent results and are intended to be embraced in the appended claims.

I claim:

1. A reference network, comprising:
   a first transistor and first and second resistors wherein said first resistor is coupled between said second resistor and a current terminal of said first transistor and wherein said first and second resistors define a feedback node therebetween;
   a second transistor and third and fourth resistors wherein said third resistor is coupled between said fourth resistor and a current terminal of said second transistor and wherein control terminals of said first and second transistors are coupled together;
   a current source that drives a current through said first transistor; and
   a feedback network arranged to drive said second and fourth resistors and reduce a difference between a feedback voltage at said feedback node and a predetermined voltage;
   current flow through said third and fourth resistors thereby providing reference signals.

2. The network of claim 1, wherein said second and fourth resistors define a shared node therebetween and further including a first capacitor coupled between said shared node and the coupled control terminals of said first and second transistors.

3. The network of claim 2, further including third and fourth transistors that are arranged to respectively drive said first and second transistors wherein said third transistor is inserted between said first transistor and said current source and wherein control terminals of said third and fourth transistors are coupled together.

4. The network of claim 3, further including a second capacitor coupled between said shared node and the coupled control terminals of said third and fourth transistors.

5. The network of claim 3, wherein the control terminal of said first transistor is coupled to a current terminal of said third transistor.

6. The network of claim 3, further including a third capacitor coupled across said second and fourth transistors and said third and fourth resistors.

7. The network of claim 3, wherein said feedback network includes:
   a differential amplifier arranged to generate a difference signal in response to the difference between said feedback voltage and said predetermined voltage;
   a feedback transistor coupled to drive said second and fourth resistors in response to said difference signal; and
   a feedback capacitor coupled across said feedback transistor.

8. The network of claim 3, further including a third capacitor coupled across feedback transistor.

9. A reference network, comprising:
   a current mirror having gate-coupled first and second transistors wherein said first transistor carries a bias current and said second transistor mirrors said bias current into a mirror current;
   a first capacitor having a first terminal coupled to the coupled gates of said first and second transistors and having a second terminal;
   serially-coupled first and second resistors arranged to carry said bias current from a source of said first transistor to said second terminal wherein said first and second resistors define a feedback node therebetween;

serially-coupled third and fourth resistors arranged to carry said mirror current from a source of said second transistor to said second terminal; and a feedback network arranged to drive said second terminal and reduce a difference between a feedback voltage at said feedback node and a predetermined voltage;

current flow through said third and fourth resistors thereby providing reference signals.

10. The network of claim 9, further including:

gate-coupled third and fourth transistors that are respectively arranged in cascode with said first and second transistors; and a current source arranged to provide said bias current to said third transistor.

11. The network of claim 10, wherein the control terminal of said first transistor is coupled to the drain of said third transistor.

12. The network of claim 10, further including a second capacitor coupled between said second terminal and the coupled gates of said third and fourth transistors.

13. The network of claim 10, further including a third capacitor coupled across said third and fourth resistors and said second and fourth transistors.

14. The network of claim 9, wherein said feedback network includes:

a differential amplifier arranged to generate a difference signal in response to the difference between said feedback voltage and said predetermined voltage;

a feedback transistor coupled to drive said second terminal in response to said difference signal; and a feedback capacitor coupled across said feedback transistor.

15. The network of claim 14, further including a third capacitor coupled across said feedback transistor.

16. A signal converter that provides a digital code which corresponds to an analog input signal, comprising:

a pipelined arrangement of converter stages configured to provide said digital code in response to said analog input signal wherein at least one of said stages includes a multiplying digital-to-analog converter that responds to reference signals; and a reference network that includes:

a first transistor and first and second resistors wherein said first resistor is coupled between said second resistor and a current terminal of said first transistor and wherein said first and second resistors define a feedback node therebetween;

a second transistor and third and fourth resistors wherein said third resistor is coupled between said fourth resistor and a current terminal of said second transistor and wherein control terminals of said first and second transistors are coupled together;

a current source that drives a current through said first transistor; and a feedback network arranged to drive said second and fourth resistors and reduce a difference between a feedback voltage at said feedback node and a predetermined voltage;

current flow through said third and fourth resistors thereby providing said reference signals.

17. The converter of claim 16, wherein said second and fourth resistors define a shared node therebetween and further including a first capacitor coupled between said shared node and the coupled control terminals of said first and second transistors.

18. The converter of claim 17, further including third and fourth transistors that are arranged to respectively drive said first and second transistors wherein said third transistor is inserted between said first transistor and said current source and wherein control terminals of said third and fourth transistors are coupled together.

19. The converter of claim 18, further including a second capacitor coupled between said shared node and the coupled control terminals of said third and fourth transistors.

20. The network of claim 17, wherein said feedback network includes:

a differential amplifier arranged to generate a difference signal in response to the difference between said feedback voltage and said predetermined voltage;

a feedback transistor coupled to drive said shared node in response to said difference signal; and a feedback capacitor coupled across said feedback transistor.

* * * * *